United States Patent [19]

Stoisiek et al.

[11] Patent Number: 4,760,432
[45] Date of Patent: Jul. 26, 1988

[54] THYRISTOR HAVING CONTROLLABLE EMITTER-BASE SHORTS

[75] Inventors: Michael Stoisiek, Ottobrunn; Horst Schmid; Helmut Strack, both of Munich, all of Fed. Rep. of Germany

[73] Assignee: Siemens Aktiengesellschaft, Berlin and Munich, Fed. Rep. of Germany

[21] Appl. No.: 923,867

[22] Filed: Oct. 28, 1986

[30] Foreign Application Priority Data

Nov. 4, 1985 [DE] Fed. Rep. of Germany ....... 3539097

[51] Int. Cl.$^4$ ............................................ H21L 29/78
[52] U.S. Cl. .................... 357/23.4; 357/23.6; 357/38; 357/43; 357/55; 357/86
[58] Field of Search .................... 357/23.4, 23.6, 38, 357/43, 86, 55

[56] References Cited

U.S. PATENT DOCUMENTS

| 4,376,286 | 3/1983 | Lidow et al. ........... | 357/23.4 |
| 4,455,565 | 6/1984 | Goodman et al. ........ | 357/23.4 |
| 4,466,176 | 8/1984 | Temple ................ | 357/23.4 |
| 4,502,071 | 2/1985 | Herberg ............... | 357/38 |
| 4,580,154 | 4/1986 | Coe ................... | 357/23.4 |
| 4,598,461 | 7/1986 | Love .................. | 357/23.4 |
| 4,611,128 | 9/1986 | Patalong .............. | 357/23.4 |
| 4,612,449 | 9/1986 | Patalong .............. | 357/38 |
| 4,613,766 | 9/1986 | Patalong .............. | 357/38 |
| 4,630,084 | 12/1986 | Tihanyi ............... | 357/43 |
| 4,641,163 | 2/1987 | Tihanyi ............... | 357/43 |

FOREIGN PATENT DOCUMENTS 2945324  5/1981  Fed. Rep. of Germany .

Primary Examiner—Joseph E. Clawson, Jr.
Attorney, Agent, or Firm—Hill, Van Santen, Steadman & Simpson

[57] ABSTRACT

A thyristor having a pnpn semiconductor body comprising MISFET structures 9 and 12 through 16 which serve as controllable emitter base shorts formed at the edge side relative to one of the emitter layers and each of the structures is composed of a semiconductor region 9 inserted into the emitter layer which is contacted by an electrode 6 for the emitter layer 1 and also includes a subregion 12 of the adjacent base layer 2 and of an intervening channel region 13 which is formed of an edge zone of the emitter layer 1 and is also composed of a gate covering the channel region in an insulated manner. The gate also convers the subregion 12 of the base layer 2 and forms a MIS capacitor C1. A voltage generator 23 drives the gate 15 with a voltage which alternates between first and second values. At the change from the first voltage value which lies below the threshold value of the channel region 13 to the second voltage level which is close to the threshold voltage of the subregion 12 of the base layer, the thyristor ignites due to the shift in current of the MIS capacitor C1 which serves as the ignition current and, thus, when the change from the second to the first voltage occurs, the thyristor is quenched.

7 Claims, 2 Drawing Sheets

THYRISTOR HAVING CONTROLLABLE EMITTER-BASE SHORTS

BACKGROUND OF THE INVENTION

1. Field of the Invention

This invention relates in general to an improved thyristor of an npnp type which includes at least one first MIS that serves as a controllable emitter base short which is provided at the edge of the n-emitter layer.

2. Description of the Prior Art

German A No. 29 45 324 discloses a thyristor wherein an MIS structure serves as a controllable emitter base short and is provided at the edge of the n-emitter layer. It comprises a p-conductive semiconductor region which is inserted into the n-emitter layer and has a subregion of the p-base layer and a channel region lying therebetween which is formed as an edge zone of the n-emitter such that the channel region is covered by a gate which is separated from the boundary surface of the semiconductor with an insulating layer. By supplying a pulse which negatively biases the gate relative to the cathode, a first p-conductive inversion channel is formed under the gate which connects the p-conductive semiconductor region and the cathode side electrode connected thereto to the p-base with low impedance. The appearance of this pulse causes the emitter base short formed by the MIS structure to be switched on. As a result, the thyristor is quenched or turned off.

Also, a further identical MIS structure is provided in the prior art thyristor with a p-conductive inversion channel switched on with a zero voltage on the gate. This prevents unintentional triggering of the thyristor. When an ignition is to occur, the gate of the MIS structure is supplied with a positive voltage pulse so that the later inversion channel is suppressed for the duration of this pulse.

SUMMARY OF THE INVENTION

It is an object of the present invention to provide an improved thyristor wherein both the ignition as well as quenching can occur using a voltage drive of the gate of one and the same MIS structure which is formed as a controllable emitter base short. An advantage obtainable with the invention in particularly comprises the simple design and control of the provided MIS structure which assures an efficient ignition and/or quenching of the thyristor. A development of the thyristor of the invention wherein one of the emitters is divided into a plurality of emitter zones at whose edges MIS structure are formed and which serve as emitter base shorts are characterized in that a largely simultaneous ignition of the thyristor is achieved in the regions of the individual emitter zones thus allowing a rapid rise rate of the load current which flows through the thyristor.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure and in which:

DESCRIPTION OF THE PREFERRED EMBODIMENTS

Figure 1:
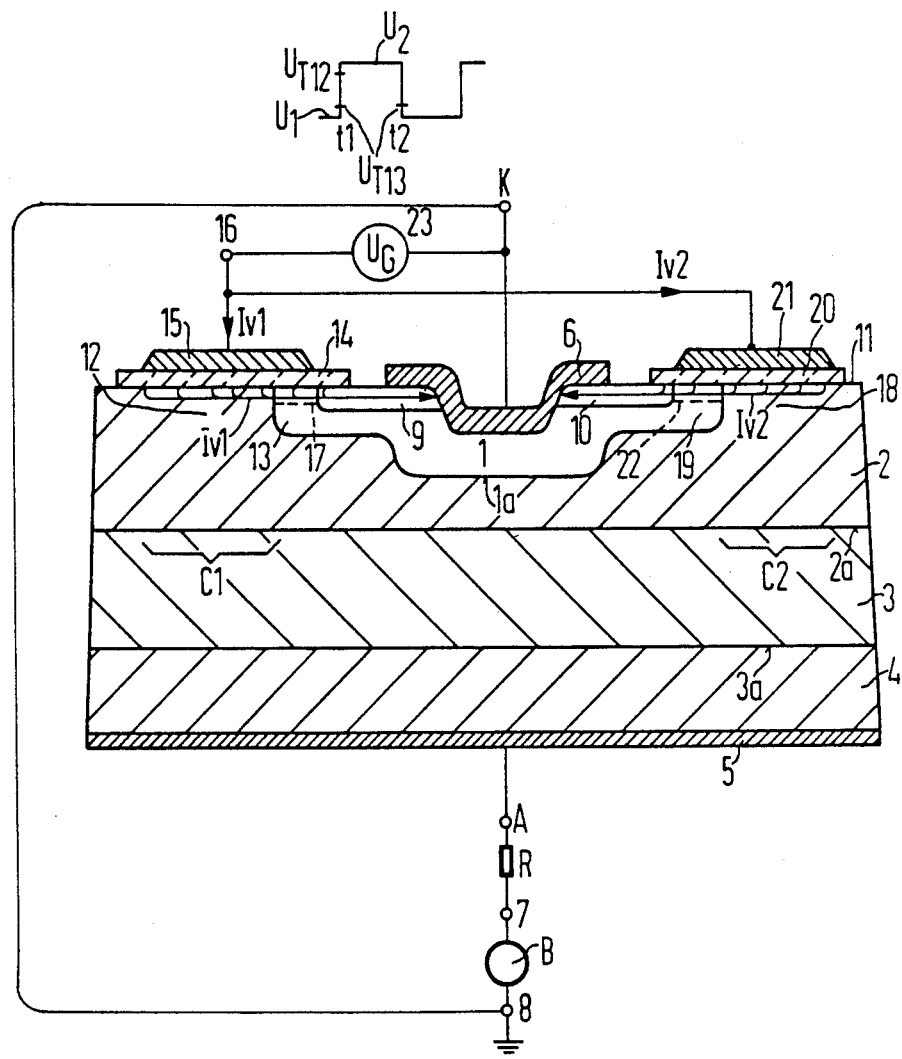
FIG. 1 is a cross-sectional view through a thyristor according to the invention and wherein the thyristor is in the inhibited condition.

FIG. 1 illustrates a thyristor according to the invention which has a semiconductor body composed of dope semiconductor material such as silicon. It comprises four successive layers of alternating conductivity type. A first layer 1 of n-conductive material is the n-emitter. The second layer of p-conductive material 2 is the p-base layer, the n-conductive layer 3 is the n-base layer and the p-conductive layer 4 is the p-emitter layer. The p-emitter layer 4 is provided with an anode electrode 5 of electrically conductive material as, for example, aluminum which is connected to a terminal A. The n-emitter is contacted by a cathode electrode 6 of electrically conductive material, for example, aluminum which is connected to a terminal K. The pn junction between the base layers 2 and 3 is indicated by 2a, the pn junction between layers 1 and 2 is referenced 1a and the pn junction between layers 3 and 4 is referenced 3a.

Terminal A is connected to a load resistor R which has its other side connected to the first terminal 7 of a voltage source B which supplies a voltage U which might be, for example, 1000 volts. The second terminal 8 of the voltage source B is connected to ground potential and is connected to terminal K.

A pair of p-conductive semiconductor regions 9 and 10 are inserted into the n-emitter layer 1 and extend up to the upper boundary surface 11 of the semiconductor body and are electrically contacted by the electrode 6. Together with the subregion 12 of the p-base layer 2 which is adjacent to the n-emitter layer at the left and together with an edge zone 13 of the n-emitter layer 1 which forms a channel region and is covered by a gate 15 separated from the boundary surface 11 by a thin electrically insulating 14, the semiconductor region 9 forms a MISFET structure which is driven with a terminal 16 connected to the gate 15. In a first switching condition of this structure, a gate voltage which is more negative than the threshold voltage of the channel region 13 or which is equal thereto is supplied at terminal 16. An inversion channel 17 is therefore built up in the channel region 13 under gate 15 and this inversion channel 17 connects the region 9 and, thus, the cathode electrode 6 to the subregion 12 in a low impedance manner and, thus, to the p-base layer 2. In other words, it practically shorts the pn junction between the layers 1 and 2. During a second switching status of the MISFET structure 9 and 12 through 16 the terminal 16 receives a voltage which exceeds the threshold voltage of the channel region 13. During this switching condition, the inversion channel does not exist so the low impedance connection between 9 and 12 or respectively, the short between layers 1 and 2 is eliminated.

In an analogous fashion, the p-conductive semiconductor region 10 contacted by the cathode electrode 6 forms a further MISFET structure together with a sub-region 18 of the p base layer 2 and an edge zone 19 of the n-emitter layer 1 together with a thin electrically insulating layer 20 and which is provided with a gate 21 controllable from the terminal 16. This structure also comprises an inversion channel 22 which due to the common control of both MISFET structures is respectively simultaneously present or absent with the inversion channel 17 depending on the respective switching status of the MISFET structures in the same manner as described above.

Similar to the thin insulating layers 14 and 20, the gates 15 and 21 are fashioned so they have such large areas that outside of the lateral limitations of the n-emitter layer 1 they respectively cover the subregions 12 and 18 of the p-base layer 2 which are respectively adjacent. The parts covering the subregions 12 and 18, thus form respective MIS capacitors C1 and C2 which are formed together with the subregions and the parts of the layers 14 and 20 which lie between. A voltage generator 23 is connected between terminals 16 and K which produces a voltage which alternates between a first voltage value U1 and a second voltage value U2. As long as a gate voltage $U_G$ equals U1 which is smaller than the threshold voltage $U_{T13}$ of the channel region 13 is applied to the terminal 16, the inversion channels 17 and 22 will be present. This will cause the thyristor to be in the inhibited condition which is shown in FIG. 1. When at time t1 the voltage $U_G$ begins to rise, then a shift current Iv1 which recharges the MIS capacitor C1 first flows in the variation range of the gate voltage from U1 through $U_{T13}$ from generator 23 through terminal 16 to the gate 15 and from subregion 12 through the inversion channel 17 and the region 9 to the electrode 6. In an analogous manner, a further shift current Iv2 which recharges C2 flows through the inversion channel 22 to the electrode 6.

Figure 2:
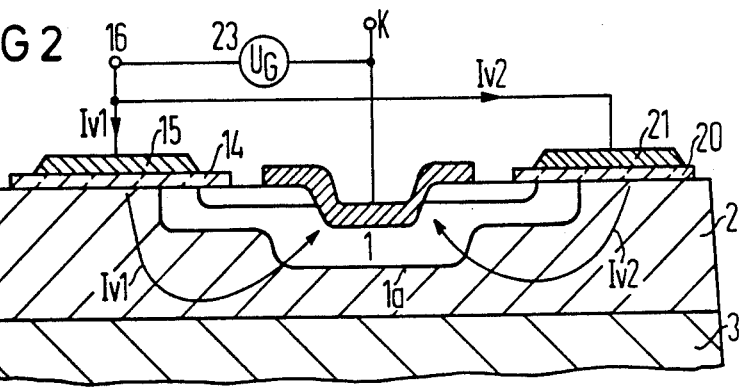
FIG. 2 is a sectional view through the thyristor during ignition.
Figure 3:
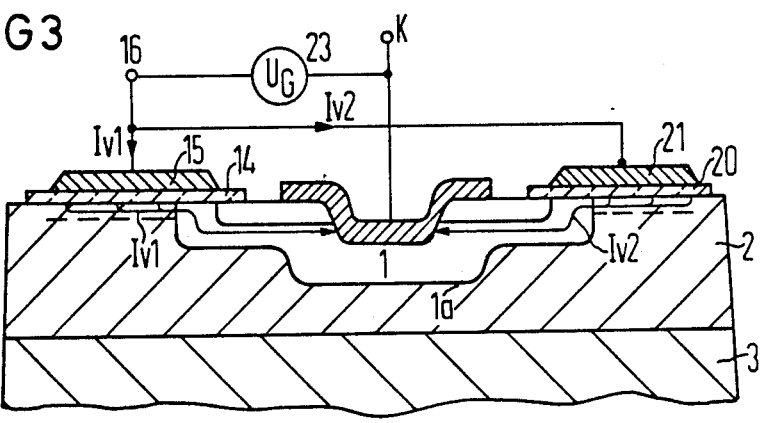
FIG. 3 is a sectional view through the thyristor during its current carrying condition.

When the voltage $U_G$ continues to increase beyond $U_{T13}$, then the inversion channel 17 and 22 will no longer be present. This condition of the thyristor is illustrated in FIG. 2. The shift currents Iv1 and Iv2 flow through the short-free pn-junction 1a to the n-emitter layer 1. The shift currents are thus to be realized as ignition currents which effect the ignition of the thyristor. This however is true only until the rising gate voltage $U_G$ has reached or exceeds the value of the threshold voltage $U_{T12}$ of the subregions 12 and 18 of the p-base layer 2. When this occurs, then as shown in FIG. 3 inversion layers 24 and 25 are formed in the subregions 12 and 18 of the p-base layer 2, or respectively, in the region of the MIS capacitors C1 and C2 and the shift currents Iv1 and Iv2 flow directly off through these into the n-emitter layer 1 and from there to the electrodes 6. In the variable range of the gate voltage from $U_{T12}$ through $U_2$, shift currents will no longer develop due to the effect of the ignition currents. When it is assumed that $U_G$ begins to rise from $U_1$ to $U_2$ at time t1 and when it is assumed that the variable range of the gate voltage from $U_{T13}$ through $U_{T12}$, is linear and occurs in a time span of $\Delta t$, then an ignition current $I_B$ which satisfies the following relationship results per surface unit for one of the MIS capacitors, for example, C1:

$$I_B = (U_{T12} - U_{T13}) \cdot C1 / \Delta t$$

Assuming a voltage difference of for example 6.6 volts between $U_{T12}$ and $U_{T13}$ and with a thickness of 80 nm for the insulating layer 14 and with $\Delta t = 100$ ns, a value of 0.44 A/cm² results for $I_B$.

After the thyristor has been ignited a load current flows in the circuit from terminal A through resistor R, terminal 7, voltage source B, terminal 8 and terminal K. At time t2, the gate voltage supplied by generator 23 is then reduced from the value U2 to the value U1; the thyristor is quenched when the value $U_{T13}$ is reached and is quenched by the gate voltage as a consequence of the activation of the inversion channels 17 and 22.

Both the ignition as well as the quenching of the thyristor thus occurs by means of a voltage drive of the same gates for example the gates 15 and 21 of the MISFET structures. The obtainable ignition current increases with the increase of the lateral surface of the MIS capacitors, for example, C1 and C2. A further increase in the ignition effect can be achieved when the p-base layer 2 in the regions 12 and 18 is more highly doped down to a penetration depth which roughly corresponds to the penetration depth of the n-emitter layer 1 than in the remaining parts. Under conditions which are otherwise identical, the shift currents Iv1 and Iv2 are thereby increased.

Figure 4:
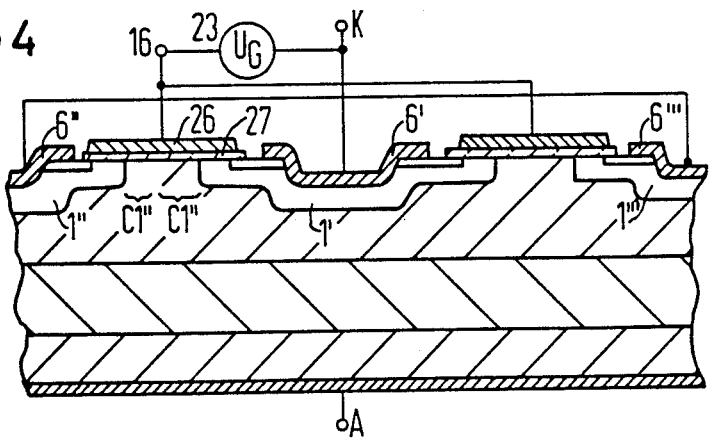
FIG. 4 illustrates a modified form of the thyristor of the invention.

FIG. 4 illustrates a modification of the invention wherein the n-emitter layer 1 is divided into a plurality of emitter zones 1', 1" and 1'" which are contacted by portions 6', 6" and 6'" of the electrode and which are connected to each other in electrically conductive fashion. A plurality of MISFET structures formed in this way respectively are provided at the edges relative to the emitter zones. The drive of all these structures occurs in common with a voltage generator. The MISFET structures thus comprise two emitter zones for example 1' and 1" which are adjacent one another and comprise a shared gate 26 and a shared thin electrically insulating layer 27. Also, present under the portion of the gate 26 which covers the clearance between the neighboring emitter zones are two MIS capacitors, for example, C1' and C1" which are adjacent one another and which are respectively associated to the neighboring emitter zones for example 1' and 1". Since every emitter zone is driven from its immediate proximity with respect to its ignition current, it results that a largely uniform ignition of the overall thyristor area occurs given a division of the n-emitter layer into a great number of emitter zones uniformly distributed over the thyristor area. This assures a fast rate of rise of the load current which flows through the thyristor.

The emitter zones 1', 1" and so forth shown in FIG. 4 are preferably fashioned in an elongated or respectively stripped fashion and occur over the entire thyristor area on a straight line or along any kind of curved lines. On the other hand, the emitter zones 1" 1'" etc. can also be formed as concentric rings and can be arranged concentrically relative to the innermost emitter zone 1' such that the emitter zone 1' is formed in an annular fashion. In FIG. 1, the n-emitter layer 1 can also be formed in an elongated or circular fashion and the reference structures 19 and 10, 14 and 20, 15 and 21, C1 and C2 can be respectively allocated to the same annularly fashioned structural part.

It is within the concept of the invention that the p-emitter of the thyristor can also be provided with the MISFET structures which have been the described and these then being driven with a voltage generator both for ignition as well as for quenching of the thyristor. FIGS. 1 through 4 serve for illustrating the invention with npnp conductivity, but it is to be realized, of course, that pnpn structure can also be used in the invention.

Although the invention has been described with respect to preferred embodiments, it is not to be so limited as changes and modifications can be made which are within the full intended scope of the invention as defined by the appended claims.

We claim as our invention:

1. A thyristor comprising, a semiconductor body having an n-emitter layer which is contacted by a cathode electrode, a p-base layer adjacent said n-emitter layer, an n-base layer adjacent said p-base layer, a p-emitter layer adjacent said n-base layer, an anode electrode in electrical contact with said p-emitter region, a biasing voltage connected between said cathode and anode electrode, said base layers separated from one another by pn-junctions, at least one first MIS structure serving as a controllable emitter-base short located at the edge of said n-emitter layer, said MIS structure comprising a p-conductive semiconductor region which is inserted into said n-emitter layer, a sub-region of said p-base layer, and said p-conductive semiconductor region formed with a first channel region lying therebetween and formed of an edgeside zone of said n-emitter layer, a first gate over said first channel region and separated from the boundary surface of the semiconductor body by a first insulating layer, said first gate (15) also covers said sub-region (12) of the p-base layer (2) and is insulated therefrom, a first voltage generator (23) connected between said cathode electrode (6) and said first gate (15), said first voltage generator generating a voltage which alternates between first and second voltage values, and said first voltage value lies below the threshold voltage of said first channel region (13); and said second voltage value is close to or exceeds the threshold turn on voltage of said sub-region (12) of said p-base layer and ignition of the thyristor occurs when the change from said first to said second voltage value occurs and the quenching of said thyrister occurs when the change from said second to said first voltage value occurs and the threshold voltage of the sub-region (12) of the p-base layer exceeds the threshold voltage of the first channel region (13).

2. A thyristor comprising a semiconductor body having an n-emitter layer which is contacted by a cathode electrode and having an adjacent p-base layer which has an adjacent n-base layer which has an adjacent p-emitter layer which is contacted by an anode electrode whereby the base layers are separated from one another by pn-junctions and at least one second MIS structure serving as a controllable emitter-base short provided at the edge of said p-emitter layer, said second MIS structure comprising an n-conductive semiconductor region which is inserted into said p-emitter layer, a subregion of said n-base layer and an intervening second channel region formed of an edge-side zone of said p-emitter layer, said second channel region covered by a second gate which is separated from the boundary surface of the semiconductor body by a second insulating layer, said second gate also covers the sub-region of said n-base layer and is insulated therefrom, a second voltage generator connected between the anode electrode and said second gate, said second voltage generator generating a voltage which alternates between third and fourth voltage values, said third voltage value lies above the threshold turn on voltage of the second channel region; said fourth voltage value is close to or exceeds the threshold turn on voltage of the sub-region of the n-base layer; and ignition of the thyristor occurs when the change from the third to the fourth voltage value occurs and quenching occurs when change from the fourth to the third voltage value occurs.

3. A thyristor according to claim 1 or 2, characterized in that one of the emitter layers is composed of a plurality of emitter zones (1', 1", 1''') which are provided with respectively allocated parts (6', 6", 6''') of the electrode contacting the emitter layer, and these parts are electrically connected to one another and a plurality of MIS structures serving as controllable emitter-base shorts are respectively provided at the edges of the emitter zones.

4. A thyristor according to claim 3, characterized in that the emitter zones (1', 1", 1''') are elongated and extend generally parallel to one another over the entire thyristor surface.

5. A thyristor according to claim 3, characterized in that the emitter zones (1", 1''') are formed of circular rings and are arranged concentrically relative to one another and relative to the innermost, circularly fashioned emitter zone (1').

6. A thyristor according to claim 1, characterized in that the p-base layer (2) under the gates (15, 21) is more highly doped proceeding from the surface (11) of the semiconductor body down to a penetration depth which roughly corresponds to that of the n-emitter layer (1), and is more highly doped therein than in its remaining parts.

7. A thyristor according to claim 2 characterized in that the n-base layer in the region of the gates is more highly doped proceeding from the surface of the semiconductor body down to a penetration depth which roughly corresponds to that of the p-emitter layer, and is more highly doped therein than in its remaining parts.

* * * * *